(12) United States Patent
Stautner

(10) Patent No.: US 10,185,003 B2
(45) Date of Patent: Jan. 22, 2019

(54) SYSTEM AND METHOD FOR ENHANCING THERMAL REFLECTIVITY OF A CRYOGENIC COMPONENT

(71) Applicant: General Electric Company, Schenectady, NY (US)

(72) Inventor: Ernst Wolfgang Stautner, Niskayuna, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 993 days.

(21) Appl. No.: 14/546,263

(22) Filed: Nov. 18, 2014

(65) Prior Publication Data

US 2016/0139219 A1    May 19, 2016

(51) Int. Cl.
| | | |
|---|---|---|
| G01V 3/00 | (2006.01) | |
| G01R 33/38 | (2006.01) | |
| G01R 33/3815 | (2006.01) | |

(52) U.S. Cl.
CPC ...... *G01R 33/3804* (2013.01); *G01R 33/3815* (2013.01)

(58) Field of Classification Search
CPC .................................................. G01R 33/3804
USPC ........................................ 324/319, 320, 318
See application file for complete search history.

(56) References Cited

U.S. PATENT DOCUMENTS

| | | | |
|---|---|---|---|
| 4,819,450 A | 4/1989 | Miller | |
| 4,902,995 A | 2/1990 | Vermilyea | |
| 4,986,078 A | 1/1991 | Laskaris | |
| 5,023,584 A | 6/1991 | Laskaris | |
| 5,045,826 A | 9/1991 | Laskaris | |
| 5,363,077 A | 11/1994 | Herd et al. | |
| 5,651,256 A | 7/1997 | Herd et al. | |
| 6,038,867 A * | 3/2000 | Einziger | G01R 33/3815 505/892 |
| 6,147,579 A | 11/2000 | Einziger et al. | |
| 6,323,749 B1 * | 11/2001 | Hsieh | G01R 33/381 335/216 |
| 6,653,835 B2 | 11/2003 | Roeckelein et al. | |
| 9,205,969 B2 * | 12/2015 | Deane | B65D 81/3802 |
| 2010/0200594 A1 | 8/2010 | Husband et al. | |
| 2012/0309630 A1 | 12/2012 | Stautner et al. | |

(Continued)

FOREIGN PATENT DOCUMENTS

| | | |
|---|---|---|
| EP | 2 699 925 A1 | 2/2014 |
| GB | 942370 A | 11/1963 |

(Continued)

OTHER PUBLICATIONS

Tsujimoto, et al., "Thermal radiative properties of some cryogenic materials", Cryogenics, vol. 22, Issue 11, Nov. 1982, 7 Pages.

(Continued)

*Primary Examiner* — Louis Arana
(74) *Attorney, Agent, or Firm* — GE Global Patent Operation; Pabitra Chakrabarti

(57) ABSTRACT

A device includes a component operable at a temperature in a range of 3.5 to 6 Kelvin. The device further includes a thermal reflective sheet comprising a plurality of layers, wound around at least a portion of the component. The device also includes a coupling device for coupling the thermal reflective sheet to at least the portion of the component.

24 Claims, 2 Drawing Sheets

(56) References Cited

U.S. PATENT DOCUMENTS

2016/0202332 A1\* 7/2016 Huang ............... G01R 33/3804
324/322
2016/0291104 A1\* 10/2016 Tsuda ........................ H01F 6/04

FOREIGN PATENT DOCUMENTS

| JP | 10256614 A | 9/1998 |
|----|------------|--------|
| JP | 2009297060 A | 12/2009 |

OTHER PUBLICATIONS

Van Oort et al., "A Cryogen-Free 0.5 Tesla MRI Magnet for Head Imaging", Advances in Cryogenic Engineering, vol. 43, pp. 139-147, 1998.
Orlowska et al., "Receiver Cryogenic System", ALMA Project Book, Chapter 6, pp. 1-20, Jan. 29, 2001.
Datasheet Brochure for Vacuum Thermal Insulation, RUAG Space GmbH (Austria), downloaded from http://www.ruag.com/de/Space/Products/Satellite_Structures2C_Mechanisms_Mechanical_Equipment/Thermal_Systems/Cryogenic_Insulation_Coolcat/Coolcat_Products/RSA_Coolcat_Brochure_2010_01_online-version.pdf, 2010, 14 Pages.
English translation of Technical data sheet of TECHNONORM vapor barrier, KORFF AG. Apr. 4, 2011, 2 Pages.
A PCT Search Report and Written Opinion issued in connection with corresponding PCT Application No. US2015/061297 dated Feb. 29, 2016.
Supplementary European Search Report and Opinion issued in connection with corresponding EP Application No. 15860549.3 dated Aug. 8, 2018.

\* cited by examiner

SYSTEM AND METHOD FOR ENHANCING THERMAL REFLECTIVITY OF A CRYOGENIC COMPONENT

BACKGROUND

The invention relates generally to cryogenic components, and more particularly to a system and method for enhancing thermal reflectivity of a cryogenic component, for example, a magnet used in a magnetic resonance imaging system.

Magnetic resonance imaging (MRI) systems used for obtaining images of intact biological systems of a human being typically include a primary superconducting magnet provided as a superconducting coil supported by a tubular former. The primary superconducting magnet is housed in a chamber cooled to around 4 Kelvin. A vacuum vessel is used to provide thermal insulation to the superconducting magnet.

The vacuum chamber bore tube has a large internal diameter to receive a human patient and for accommodating the gradient or pulse coils used for generating field gradients in three orthogonal directions relative to the principal magnetic field. As a result of the nature of the gradient coils, it is necessary to have substantial heat insulation between the primary superconducting magnet and the gradient coils so as to insulate the primary superconducting magnet both from higher environmental temperature of the gradient coils and from the heat generated during use of these coils.

In low cryogen magnet type MRI systems, a magnet is exposed to vacuum. The surface structure of such a magnet is made of different materials, resulting in different surface finish and roughness. In addition to the magnet, components mounted on the coil former have cavities with low thermal reflectivity that results in increased heat load to the cartridge.

BRIEF DESCRIPTION

In accordance with one embodiment, a device is disclosed. The device includes a component operable at a temperature in a range of 3.5 to 6 Kelvin. The device further includes a thermal reflective sheet comprising a plurality of layers, wound around at least a portion of the component. The device also includes a coupling device for coupling the thermal reflective sheet to at least the portion of the component.

In accordance with another embodiment, a magnetic resonance imaging system is disclosed. The magnetic resonance imaging system includes a plurality of magnets operable at a temperature in a range of 3.5 to 6 Kelvin. The magnetic resonance imaging system further includes a thermal reflective sheet comprising a plurality of layers, wound around at least a portion of each magnet. The magnetic resonance imaging system also includes a coupling device for coupling the thermal reflective sheet to at least the portion of each magnet.

In accordance with yet another embodiment, a method is disclosed. The method involves winding a thermal reflective sheet comprising a plurality of layers, around at least a portion of the component operable at a temperature in a range of 3.5 to 6 Kelvin. The method further involves coupling the thermal reflective sheet to at least the portion of the component via a coupling device.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

In accordance with certain embodiments of the present invention, a device is disclosed. The device includes a component operable at a temperature in a range of 3.5 to 6 Kelvin and a thermal reflective sheet including a plurality of layers, wound around at least a portion of the component. The device further includes a coupling device for coupling the thermal reflective sheet to at least the portion of the component. In accordance with another embodiment, a magnetic resonance imaging system is disclosed. The magnetic resonance imaging system includes a plurality of magnets operable at a temperature in a range of 3.5 to 6 Kelvin and a thermal reflective sheet comprising a plurality of layers, wound around at least a portion of each magnet. The magnetic resonance imaging system further includes a coupling device for coupling the thermal reflective sheet to at least the portion of each magnet and a patient support device movable along a space between the plurality of magnets. In accordance with yet another embodiment, a method involves winding a thermal reflective sheet having a plurality of layers, around at least a portion of the component operable at a temperature in a range of 3.5 to 6 Kelvin. The method further involves coupling the thermal reflective sheet to at least the portion of the component via a coupling device.

Figure 1:
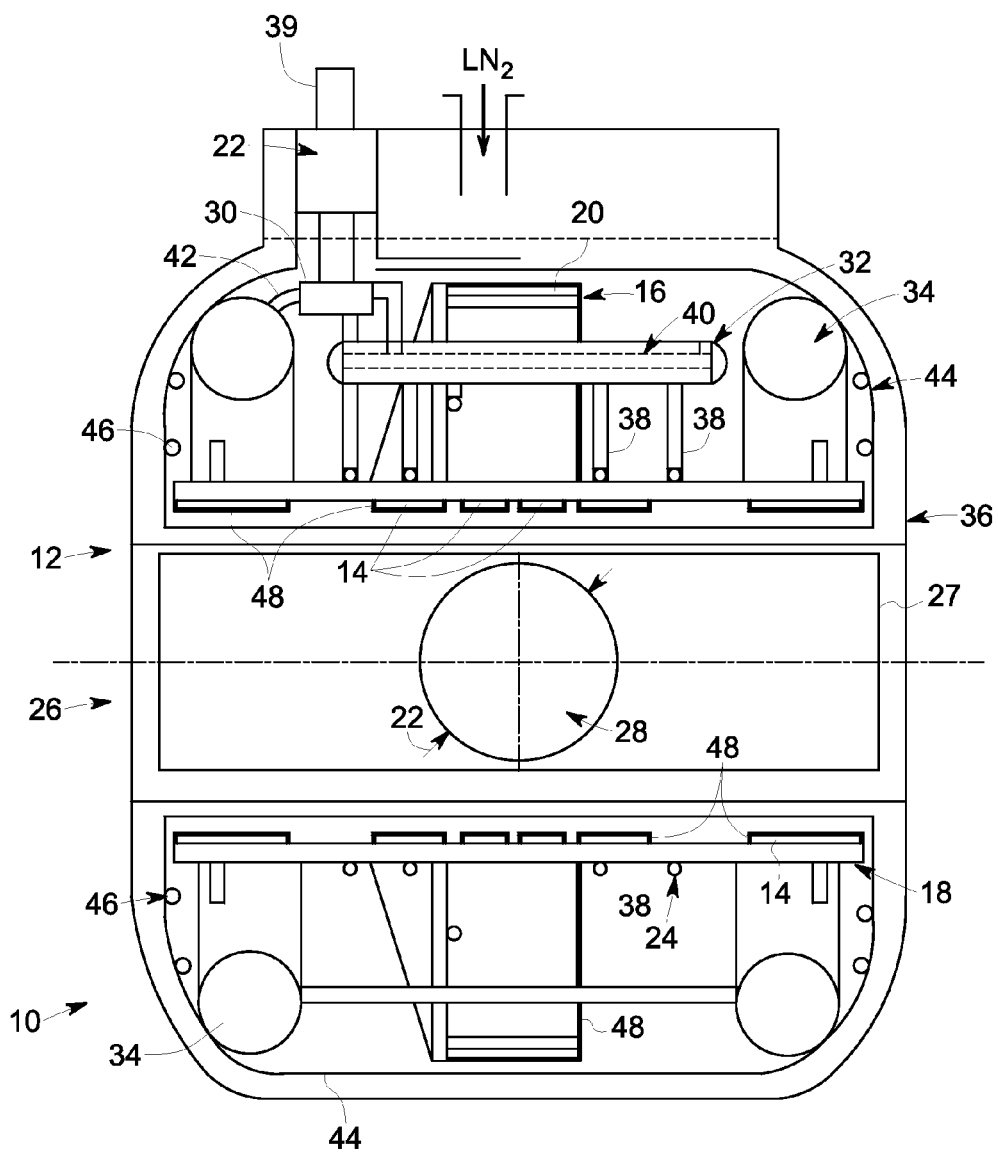
FIG. 1 is a side schematic view of an exemplary magnetic resonance imaging system in accordance with an exemplary embodiment.

Referring to FIG. 1, a side schematic view of an exemplary magnetic resonance imaging system 10 in accordance with an exemplary embodiment is shown. The magnetic resonance imaging system 10 has a low cryogen magnet arrangement providing cryorefrigeration as described in detail herein. In the illustrated embodiment, the magnetic resonance imaging system 10 includes a superconducting magnet system 12 having a plurality of concentric superconducting main coils 14 and bucking coils 16 supported inside cylindrical shells namely a coil support shell 18 and a coil support shell 20 of high thermal conductivity. The superconducting magnet system 12 is cooled by a cryorefrigerator 22 using a helium thermosiphon system. A radial spacing is provided between the plurality of superconducting main coils 14 and the bucking coils 16. In some embodiments, the coil support shells 18, 20 are formed from metal. A plurality of cooling tubes 24 are thermally coupled (e.g., bonded) to an outside surface of the coil support shell 18. In one embodiment, the coil support shells shell 18, 20 may have circumferentially extending solid metal walls that define a bore therein.

The superconducting main coils 14 and bucking coils 16 in various embodiments are molded with epoxy resin. The superconducting main coils 14 and bucking coils 16 then may be bonded to the outer surface of the coil support shells 18, 20. The superconducting main coils 14 and bucking coils 16 are shrink fitted and bonded inside the coil support shells 18, 20, to provide good thermal contact. The superconducting main coils 14 and bucking coils 16 are sized to define a bore 26 there through which is used to image an object (e.g., a patient). For example, a field of view (FOV) 28 may be defined to image a particular portion of the object. A patient support device 27 is movable along a space within bore 26.

In the illustrated embodiment, the helium thermosiphon arrangement includes the plurality of the cooling tubes 24 thermally coupled to the coil support shells 18, 20, a recondenser 30 thermally coupled to the cryorefrigerator 22, and helium storage vessels including a liquid helium storage system 32 and a helium gas storage system 34 contained inside a magnet vacuum vessel 36. The fluid communication between the cooling tubes 24 and the liquid helium storage system 32 may be provided via one or more fluid passageways 38. A motor 39 of the cryorefrigerator 22 is provided outside the vacuum vessel 36.

The cooling tubes 24 are also in fluid communication with a vapor return manifold 40, which is in fluid communication with a helium gas storage system 34 through the recondenser 30. The fluid communication between the recondenser 30 and the liquid helium storage system 32 is provided via one or more passageways 42.

In the illustrated embodiment, a thermal shield 44 is provided in thermal contact with the helium gas storage system 34. The thermal shield 44 is thermally coupled to a plurality of cooling tubes 46 (e.g., pre-cooling tubes), which in various embodiments are different than and not in fluid communication with the cooling tubes 24. For example, the cooling tubes 24 provide cooling using helium and the cooling tubes 46 may provide cooling, using liquid nitrogen.

In the illustrated embodiment, a thermal reflective sheet 48 is wound around each of the superconducting main coils 14 and bucking coils 16, a coupling device (not shown in FIG. 1) for coupling the thermal reflective sheet 48 to each of the superconducting main coils 14 and bucking coils 16. The thermal reflective sheet 48 is wound around at least a portion or completely around the each of the superconducting main coils 14 and bucking coils 16. In some other embodiments, the thermal reflective sheet 48 is wound around the liquid helium storage system 32, fluid passageways 38, and vapor return manifold 40. The magnet system 12 is exposed to vacuum and requires a high thermal reflecting surface to minimize heat load by thermal radiation. The thermal reflective sheet 14 provides a low thermal emissivity coefficient that is required to minimize heat loads to the magnet system 12. The magnet system 12 and the thermal reflective sheet 48 are explained in detail with reference to subsequent figures.

Although the magnet system 12 in the magnetic resonance imaging system 10 is discussed, the thermal reflective sheet is applicable to all surfaces that have a working temperature in a range of 3.5 to 6 Kelvin. The range of application may vary from simple cryostats, cryo-containers, superconducting magnet surfaces that are exposed to vacuum. For cryostats and cryo-containers, the exemplary thermal reflective sheet facilitates to reduce evaporation of liquid helium or the heat load to a magnet irrespective of a surface quality of a coil former or the magnet. In one embodiment, the exemplary thermal reflective sheet may be application for a G10 type surface or a stainless steel surface for reducing an emissivity coefficient.

Figure 2:
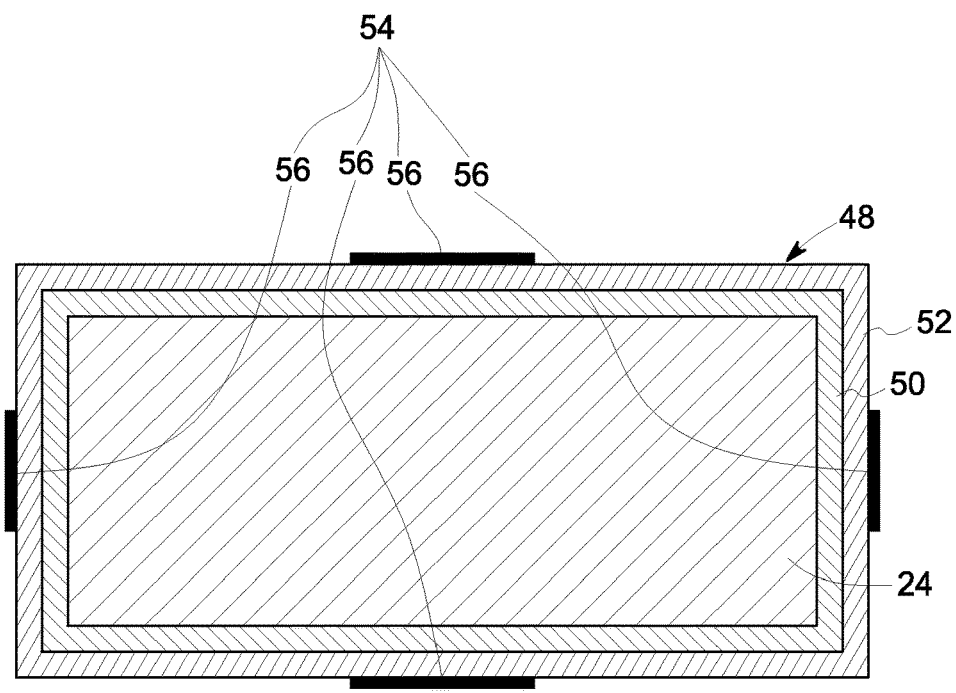
FIG. 2 is a schematic sectional view of an exemplary thermal reflective sheet wound around a superconducting main coil in accordance with an embodiment of the present invention.

Referring to FIG. 2, a schematic sectional view of the exemplary thermal reflective sheet 48 wound around the superconducting main coil 24 in accordance with an exemplary embodiment is shown. In the illustrated embodiment, the thermal reflective sheet 48 includes a first aluminum layer 50 having a purity in a range of 99.0 percent to 99.99 percent disposed contacting the superconducting main coil 24. The first aluminum layer 50 may be wound completely around the superconducting main coil 24 or at least a portion of the superconducting main coil 24. The first aluminum layer 50 has a thickness in a range of 10 to 50 micrometers. A mesh layer 52 is disposed on the first aluminum layer 50. The mesh layer 52 may be a glass fiber mesh layer, polyethylene mesh layer, polytetrafluoroethylene mesh layer, and the like. The mesh layer 52 has a thickness in a range of 0.02 to 0.1 mm. The smaller square portions of the mesh layer 52 confine and reduce the eddy current heating effect during gradient switching.

A coupling device 54 is used for coupling the thermal reflective sheet 48 to the superconducting main coil 24. In the illustrated embodiment, the coupling device 54 includes a plurality of adhesive tapes 56 for bonding the thermal reflective sheet 48 to the superconducting main coil 24. The number of adhesives tapes 56 may vary depending on the application. In other embodiments, other types bonding or gluing or other clamping mechanisms may be used to couple the thermal reflective sheet 48 to the superconducting main coil 24. The thermal reflective sheet 48 has a thickness in a range of 10 to 100 micrometers. The thermal reflective sheet 48 having a single aluminum layer 50 is easier to handle and for winding around tight curvature surfaces. Although one set of the first aluminum layer 50 and the mesh layer 52 is disclosed, in other embodiments, the number of sets of the first aluminum layer 50 and the mesh layer 52 in the thermal reflective sheet 48 may vary.

Figure 3:
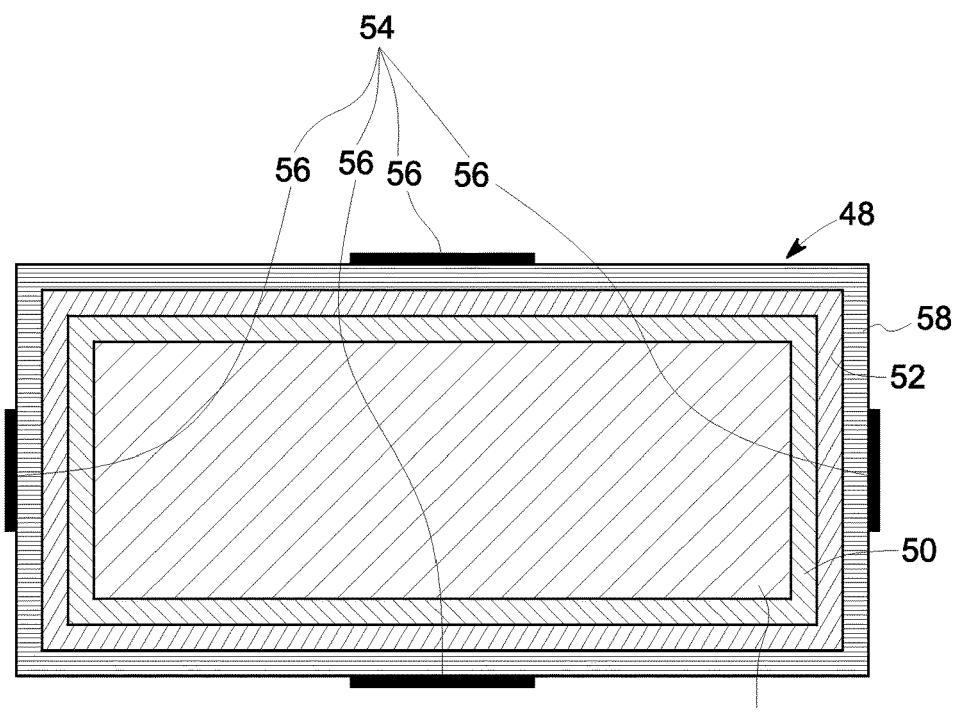
FIG. 3 is a schematic sectional view of an exemplary thermal reflective sheet wound around a superconducting main coil in accordance with another embodiment of the present invention.

Referring to FIG. 3, a schematic sectional view of the exemplary thermal reflective sheet 48 wound around the superconducting main coil 24 in accordance with an exemplary embodiment is shown. In the illustrated embodiment, the thermal reflective sheet 48 includes the first aluminum layer 50 having a purity in a range of 99.0 percent to 99.99 percent disposed contacting the superconducting main coil 24. The mesh layer 52 is disposed on the first aluminum layer 50. Additionally, the thermal reflective sheet 48 includes a second aluminum layer 58 having a purity in a range of 99.0 percent to 99.99 percent. Specifically, the mesh layer 52 is disposed between the first aluminum layer 50 and the second aluminum layer 58. The provision of the mesh layer 52 ensures good contact with a metal mating surface of the former and reduces eddy current effects.

In the illustrated embodiment, the coupling device 54 includes a plurality of adhesive tapes 56 for bonding the thermal reflective sheet 48 to the superconducting main coil 24. In other embodiments, other types bonding or gluing or other clamping mechanisms may be used to couple the thermal reflective sheet 48 to the superconducting main coil 24. Although one set of the first aluminum layer 50, the second aluminum layer 58, and the mesh layer 52 is disclosed, in other embodiments, the number of sets of the first aluminum layer 50, the second aluminum layer 58, and the mesh layer 52 in the thermal reflective sheet 48 may vary.

In accordance with the embodiments discussed herein, the thermal reflective sheet 48 reduces the surface emissivity and does not fold, warp, and tear while being wrapped around components. Further, the sheet surface does not crease or shrink when cooled. The thermal reflective sheet 48 can be removed easily from the surface of the component and reapplied to the surface of the component.

In accordance with the embodiments discussed herein, the exemplary thermal reflective sheet reduces the surface emissivity when used as a cover for openings. The thermal reflective sheet does not move when subjected to higher fields, for example up to 3 Tesla, after quench, during warm-up or cool down. Further, no adhesive is required on a mating surface. The adhesive tape does not tear the thermal reflective sheet when applied.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A device comprising:
    a cryogenic component exposed to vacuum and operable at a temperature in a range of 3.5 to 6 Kelvin;
    a thermal reflective sheet comprising a plurality of layers, wound around contacting at least a portion of the cryogenic component; and
    a coupling device for coupling the thermal reflective sheet to at least the portion of the cryogenic component.

2. The device of claim 1, wherein the cryogenic component is a magnetic resonance imaging magnet.

3. The device of claim 1, wherein the plurality of layers comprises a first aluminum layer having a purity in a range of 99.0 percent to 99.99 percent disposed contacting at least the portion of the cryogenic component.

4. The device of claim 3, wherein the first aluminum layer has a thickness in a range of 10 to 50 micrometers.

5. The device of claim 3, wherein the plurality of layers further comprises a mesh layer disposed on the first aluminum layer.

6. The device of claim 5, wherein the mesh layer has a thickness in a range of 0.02 to 0.1 mm.

7. The device of claim 5, wherein the plurality of layers further comprises a second aluminum layer having a purity in a range of 99.0 percent to 99.99 percent, wherein the mesh layer is disposed between the first aluminum layer and the second aluminum layer.

8. The device of claim 7, wherein the second aluminum layer has a thickness in a range of 10 to 50 micrometers.

9. The device of claim 1, wherein the thermal reflective sheet has a thickness in a range of 10 to 100 micrometers.

10. The device of claim 1, wherein the coupling device comprises an adhesive tape.

11. A magnetic resonance imaging system comprising:
    a plurality of magnets exposed to vacuum and operable at a temperature in a range of 3.5 to 6 Kelvin;
    a thermal reflective sheet comprising a plurality of layers, wound around contacting at least a portion of each magnet; and
    a coupling device for coupling the thermal reflective sheet to at least the portion of each magnet.

12. The magnetic resonance imaging system of claim 11, wherein the plurality of layers comprises a first aluminum layer having a purity in a range of 99.0 percent to 99.99 percent disposed contacting at least the portion of each magnet.

13. The magnetic resonance imaging system of claim 12, wherein the first aluminum layer has a thickness in a range of 10 to 50 micrometers.

14. The magnetic resonance imaging system of claim 12, wherein the plurality of layers further comprises a mesh layer disposed on the first aluminum layer.

15. The magnetic resonance imaging system of claim 14, wherein the mesh layer has a thickness in a range of 0.02 to 0.1 mm.

16. The magnetic resonance imaging system of claim 14, wherein the plurality of layers further comprises a second aluminum layer having a purity in a range of 99.0 percent to 99.99 percent, wherein the mesh layer is disposed between the first aluminum layer and the second aluminum layer.

17. The magnetic resonance imaging system of claim 16, wherein the second aluminum layer has a thickness in a range of 10 to 50 micrometers.

18. The magnetic resonance imaging system of claim 11, wherein the thermal reflective sheet has a thickness in a range of 10 to 100 micrometers.

19. The magnetic resonance imaging system of claim 11, wherein the coupling device comprises an adhesive tape.

20. A method comprising:
    winding a thermal reflective sheet comprising a plurality of layers, around contacting at least a portion of a cryogenic component exposed to vacuum and operable at a temperature in a range of 3.5 to 6 Kelvin; and
    coupling the thermal reflective sheet to at least the portion of the cryogenic component via a coupling device.

21. The method of claim 20, wherein the cryogenic component is a magnetic resonance imaging magnet.

22. The method of claim 20, wherein winding a reflective sheet comprises contacting a first aluminum layer having a purity in a range of 99.0 percent to 99.99 percent to at least the portion of the cryogenic component.

23. The method of claim 22, wherein winding a reflective sheet further comprises disposing a mesh layer on the first aluminum layer.

24. The method of claim 23, wherein winding a reflective sheet further comprises disposing a second aluminum layer having a purity in a range of 99.0 percent to 99.99 percent on the mesh layer, wherein the mesh layer is disposed between the first aluminum layer and the second aluminum layer.

* * * * *